United States Patent
Jelinek et al.

(10) Patent No.: US 10,128,328 B2
(45) Date of Patent: Nov. 13, 2018

(54) METHOD OF MANUFACTURING SEMICONDUCTOR DEVICES AND SEMICONDUCTOR DEVICE CONTAINING HYDROGEN-RELATED DONORS

(71) Applicant: Infineon Technologies AG, Neubiberg (DE)

(72) Inventors: Moriz Jelinek, Villach (AT); Hans Weber, Bayerisch Gmain (DE); Hans-Joachim Schulze, Taufkirchen (DE); Johannes Georg Laven, Taufkirchen (DE); Werner Schustereder, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/793,530

(22) Filed: Oct. 25, 2017

(65) Prior Publication Data

US 2018/0122895 A1    May 3, 2018

(30) Foreign Application Priority Data

Oct. 31, 2016 (DE) .................. 10 2016 120 771

(51) Int. Cl.
*H01L 29/06* (2006.01)
*H01L 29/66* (2006.01)
(Continued)

(52) U.S. Cl.
CPC ...... *H01L 29/0615* (2013.01); *H01L 21/2253* (2013.01); *H01L 21/26513* (2013.01);
(Continued)

(58) Field of Classification Search
CPC .............. H01L 29/0615; H01L 29/872; H01L 29/7395; H01L 29/7811; H01L 21/3003; H01L 29/66143; H01L 21/26513; H01L 21/78; H01L 22/14; H01L 21/324; H01L 29/0847; H01L 29/0684; H01L 29/1095; H01L 21/22
See application file for complete search history.

(56) References Cited

U.S. PATENT DOCUMENTS

2003/0201442 A1   10/2003   Makita et al.
2014/0033797 A1*  2/2014    Veirman ................. H01L 22/12
                                                       73/31.06
(Continued)

*Primary Examiner* — Karen Kusumakar
(74) *Attorney, Agent, or Firm* — Murphy, Bilak & Homiller, PLLC

(57) ABSTRACT

Crystal lattice defects are generated in a horizontal surface portion of a semiconductor substrate and hydrogen-related donors are formed in the surface portion. Information is obtained about a cumulative dopant concentration of dopants, including the hydrogen-related donors, in the surface portion. Based on the information about the cumulative dopant concentration and a dissociation rate of the hydrogen-related donors, a main temperature profile is determined for dissociating a defined portion of the hydrogen-related donors. The semiconductor substrate is subjected to a main heat treatment applying the main temperature profile to obtain, in the surface portion, a final total dopant concentration deviating from a target dopant concentration by not more than 15%.

23 Claims, 17 Drawing Sheets

(51) Int. Cl.
*H01L 29/36* (2006.01)
*H01L 29/167* (2006.01)
*H01L 29/32* (2006.01)
*H01L 21/225* (2006.01)
*H01L 29/10* (2006.01)
*H01L 29/08* (2006.01)
*H01L 29/872* (2006.01)
*H01L 21/66* (2006.01)
*H01L 21/78* (2006.01)
*H01L 21/265* (2006.01)
*H01L 21/30* (2006.01)
*H01L 29/78* (2006.01)
*H01L 29/739* (2006.01)
*H01L 21/324* (2006.01)

(52) U.S. Cl.
CPC ........ *H01L 21/3003* (2013.01); *H01L 21/324* (2013.01); *H01L 21/78* (2013.01); *H01L 22/14* (2013.01); *H01L 29/0684* (2013.01); *H01L 29/0847* (2013.01); *H01L 29/1095* (2013.01); *H01L 29/167* (2013.01); *H01L 29/32* (2013.01); *H01L 29/36* (2013.01); *H01L 29/66143* (2013.01); *H01L 29/66333* (2013.01); *H01L 29/66712* (2013.01); *H01L 29/7395* (2013.01); *H01L 29/7811* (2013.01); *H01L 29/872* (2013.01)

(56) References Cited

U.S. PATENT DOCUMENTS

2015/0055677 A1\* 2/2015 Veirman ................ H01L 22/14
  374/45
2015/0311279 A1   10/2015 Yoshimura et al.

\* cited by examiner

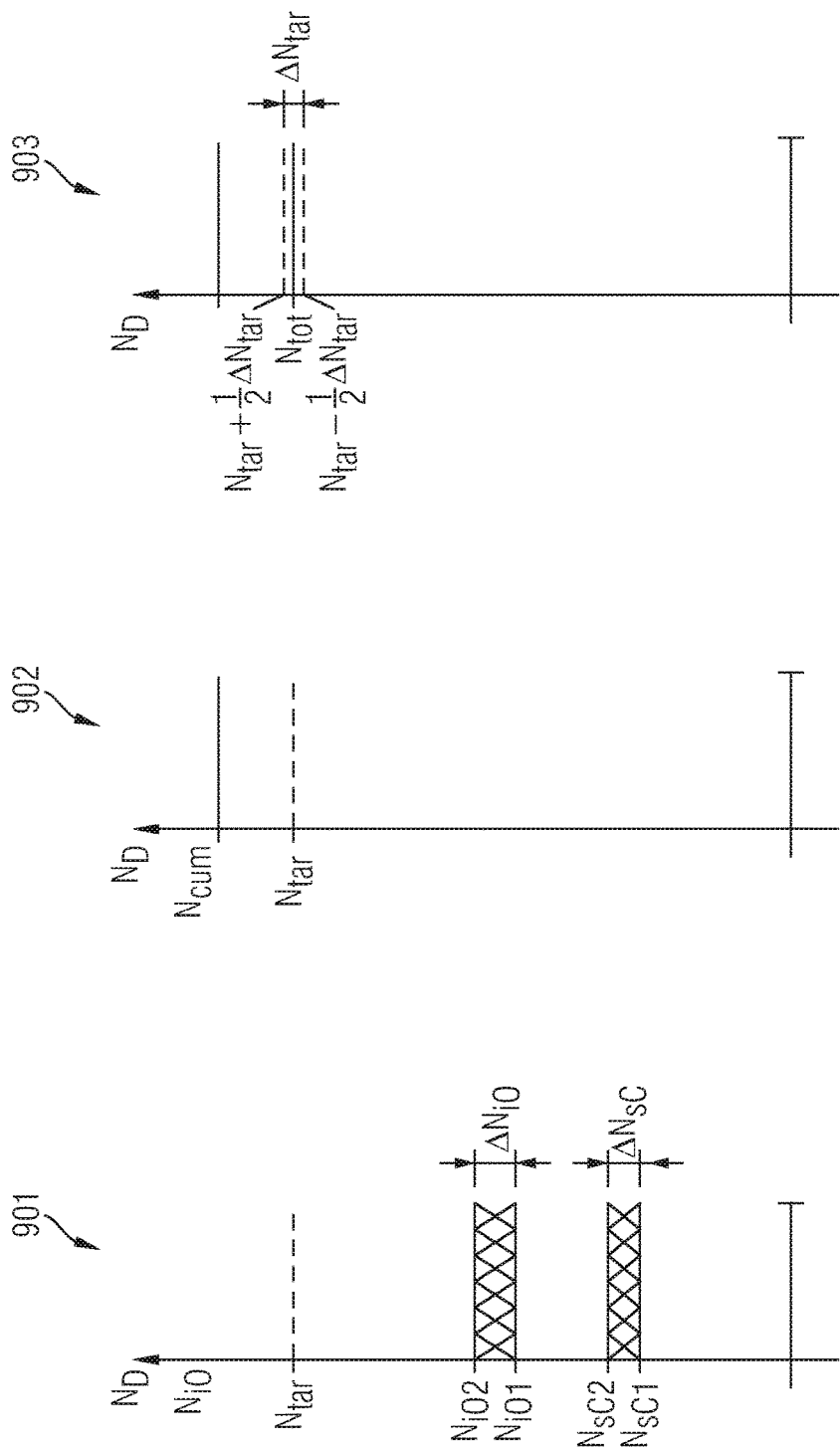

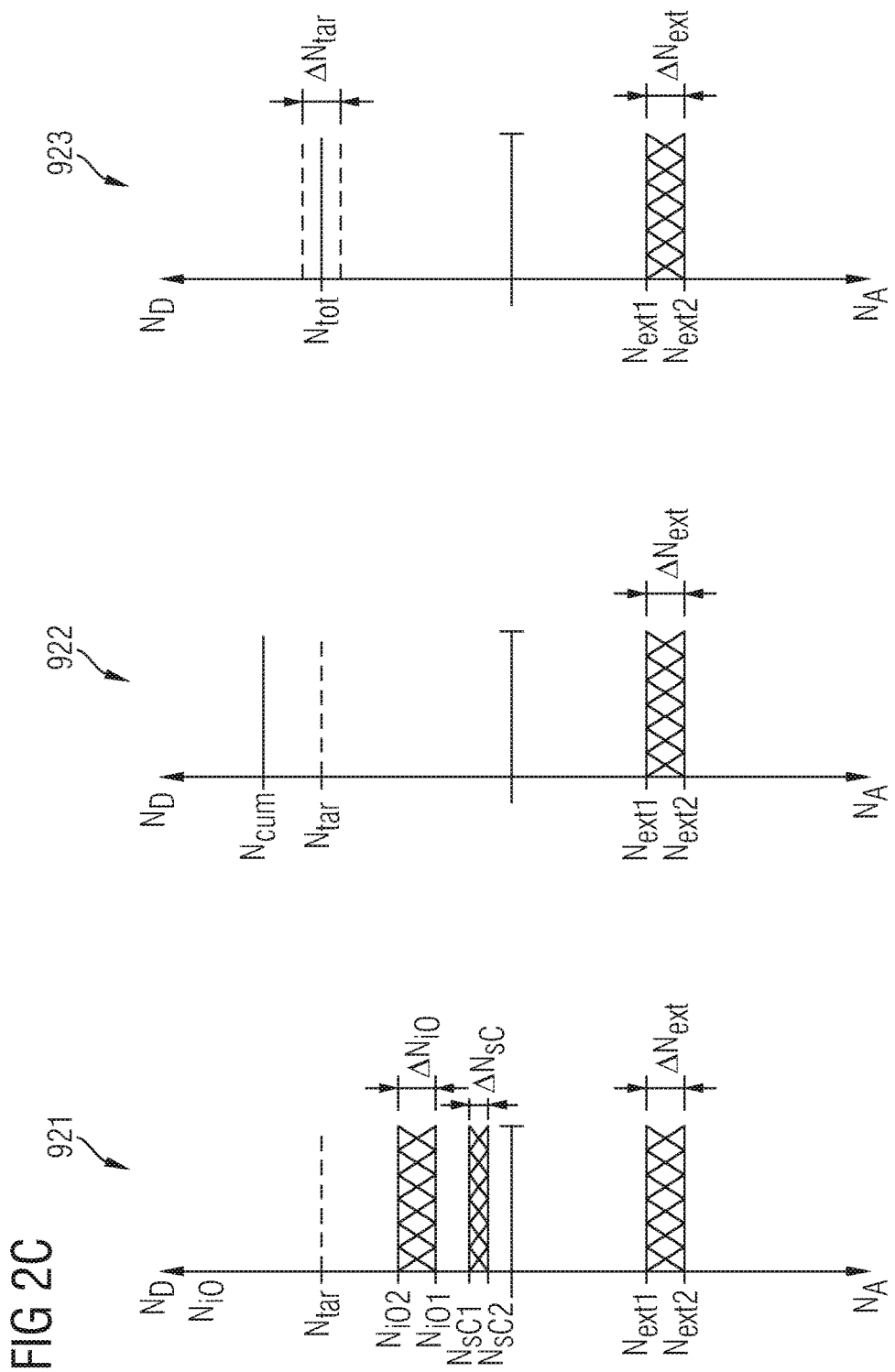

METHOD OF MANUFACTURING SEMICONDUCTOR DEVICES AND SEMICONDUCTOR DEVICE CONTAINING HYDROGEN-RELATED DONORS

BACKGROUND

Power semiconductor devices typically include a low-doped drift zone across which the blocking voltage drops. When the drift zone is formed in an epitaxial layer grown on a heavily doped semiconductor base, in-situ doping during the epitaxial growth facilitates a highly homogeneous distribution of the dopants within the epitaxial layer. Since the growth rate of epitaxial layers is about 1 µm per minute, the process is comparatively expensive for drift zones with a thickness of 100 µm and more. Therefore, semiconductor wafers for the manufacture of semiconductor devices with high blocking capability are typically obtained by sawing from silicon ingots, which grow from a localized floating melting zone of a rod from a raw material. During the floating zone melting process, the growing silicon crystal typically incorporates dopant atoms at comparatively high homogeneity across the length and the diameter of the silicon ingot but the costs of this process are relatively high and the maximum available wafer diameter is 12". Drawing a silicon ingot from molten raw material in a crucible in a Czochralski process, on the other hand, provides silicon ingots with diameters greater than 12" in an economic way but at the costs of comparatively high axial inhomogeneity.

It is desirable to improve the manufacture of power semiconductor devices.

SUMMARY

According to an embodiment a method of manufacturing semiconductor devices includes generating crystal lattice defects in a horizontal surface portion of a semiconductor substrate and forming hydrogen-related donors in the surface portion. Information is obtained about a cumulative dopant concentration of dopants, including the hydrogen-related donors, in the surface portion. Based on the information about the cumulative dopant concentration and a dissociation rate of the hydrogen-related donors, a main temperature profile is determined for dissociating a defined portion of the hydrogen-related donors. The semiconductor substrate is subjected to a main heat treatment applying the main temperature profile to obtain, in the surface portion, a final total dopant concentration deviating from a target dopant concentration by not more than 15%.

According to another embodiment a semiconductor device includes a semiconductor portion including a drift zone with a total dopant concentration in a range from 1E12 $cm^{-3}$ to 1E17 $cm^{-3}$, wherein a ratio of hydrogen-related donors to a total of extrinsic donors is at least 25% and wherein the hydrogen-related donors including oxygen atoms, carbon atoms or both oxygen and carbon atoms, as well as hydrogen-related donors containing neither oxygen nor carbon atoms.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 2A is a schematic diagram for illustrating dopant concentrations and concentration of interstitial oxygen at different process stages according to an embodiment concerning high-resistive semiconductor substrates.

FIG. 2C is a schematic diagram for illustrating dopant concentrations and concentration of interstitial oxygen at different process stages according to an embodiment concerning n-type semiconductor substrates.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1:
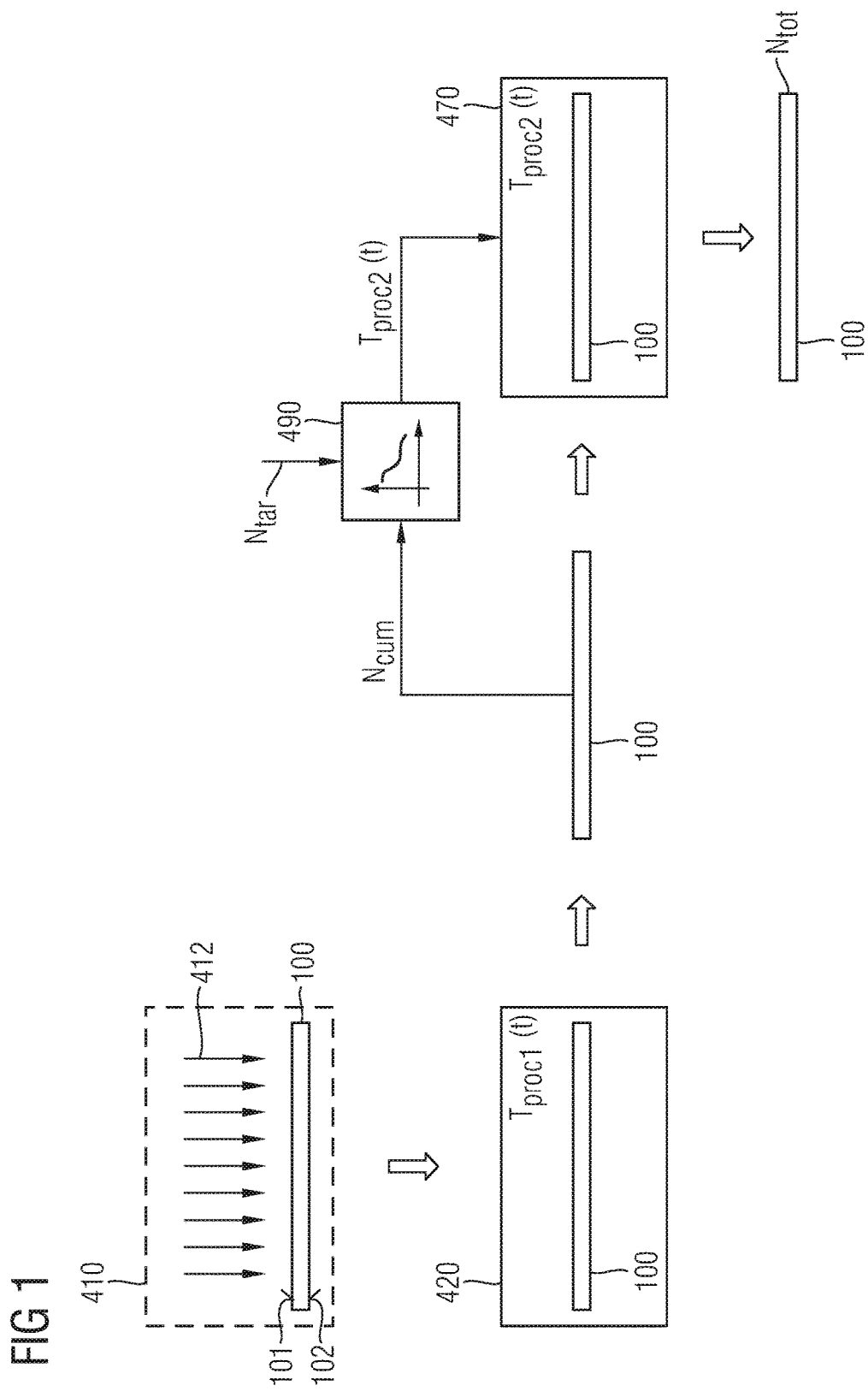
FIG. 1 is a schematic block diagram for illustrating a method of manufacturing a semiconductor device by generating a sufficiently high cumulative dopant concentration and lowering the cumulative dopant concentration by dissociating excess HDs (hydrogen-related donors) in a feed-forward process.

FIG. 1 shows a semiconductor substrate 100 at different stages of processing. The material of the semiconductor substrate 100 is a crystalline semiconductor material, for example silicon (Si), silicon carbide (SiC), germanium (Ge), silicon germanium (SiGe), gallium nitride (GaN), gallium arsenide (GaAs) or any other $A_{III}B_V$ semiconductor. The semiconductor substrate 100 may be a single-crystalline silicon wafer with a planar front surface 101 and a supporting surface 102 on the back opposite to the front surface 101, e.g., from monocrystalline Czochralski silicon (Cz:Si) obtained by sawing from a cylindrical silicon ingot extracted from a silicon melt in a crucible in a Czochralski process in the absence of magnetic fields, magnetic Czochralski silicon (mCz:Si) obtained by applying a strong magnetic field controlling the convection flow in the silicon melt during extraction of the silicon ingot from the silicon melt, or floating zone silicon (Fz:Si) obtained from a silicon ingot extracted from a melting zone of a rod from a non-single crystalline raw material.

Shape, dimensions and material of the semiconductor substrate 100 are compatible with production lines for silicon-based semiconductor devices. For example, the semiconductor substrate 100 may be a silicon wafer with an approximately cylindrical shape, wherein the diameter of the silicon wafer may be at least 150 mm, e.g., 200 mm ("8 inch"), 300 mm ("12 inch"), or 450 mm ("18 inch"). A thickness of the semiconductor substrate 100 may be between 100 µm and several millimeters, e.g., in a range from 500 µm to 2 mm, by way of example. A normal to the front surface 101 defines a vertical direction. Directions parallel to the front surface 101 are horizontal directions.

The semiconductor substrate 100 is subjected to processes for forming electronic elements in and on the semiconductor substrate 100. At a suitable stage of processing, a sequence of processes generates HDs (hydrogen-related donors) in at least a horizontal surface portion of the semiconductor substrate 100, which extends along and parallel to the front surface 101.

The process of generating HDs may start with the generation of crystal lattice defects at least in the surface portion of the semiconductor substrate 100, wherein the surface portion directly adjoins to the front surface 101. For example, an implantation apparatus 410 irradiates the front surface 101 with a particle beam 412 containing particles, e.g., electrons, neutrons, protons or helium ions. The particles enter the semiconductor substrate 100 through the front surface 101, traverse the surface portion and come to rest around an end-of-range peak in the semiconductor substrate 100, wherein inter alia mass and energy of the particles define a distance of the end-of-range peak to the front surface 101.

In the surface portion the traversing particles generate intrinsic point defect complexes, for example vacancy or multi-vacancy complexes, wherein a mean defect density Ndd in the area of the end-of-range peak may be in range from 1E17 cm-3 to 1E20 cm-3 and a mean defect density Ndd in the traversed surface portion between the front surface 101 and the end-of-range peak is approximately 10% of the mean defect density Ndd in the area of the end-of-range peak. Then a preparatory heat treatment diffuses hydrogen into the traversed surface portion. In case the particle beam 412 contains a sufficient number of protons, the semiconductor substrate 100 may be directly transferred to a first heating chamber 420 that subjects the semiconductor substrate 100 to the preparatory heat treatment in course of which the implanted hydrogen diffuses from the region around the end-of-range peak into both vertical directions.

Hydrogen atoms diffusing through an unaffected base portion of the semiconductor substrate 100 between the end-of-range peak and the supporting surface 102 remain electrically inactive and have not further impact on the dopant concentration in the semiconductor substrate 100.

In the surface portion between the front surface 101 and the end-of-range peak, the crystal lattice defects getter hydrogen atoms and transform into electrically active defect complexes containing hydrogen, i.e., hydrogen-related donors (HDs).

In case the hydrogen content in the semiconductor substrate 100 is not sufficient, for example, in case the particle beam 412 contains other particles than protons for the creation of vacancies, formation of the hydrogen-related donors may further include in-diffusion from a hydrogen plasma source before the preparatory heat treatment.

The preparatory heat treatment applies a preparatory temperature profile Tproc1($t$), e.g., an isothermal process with a preparatory process temperature T1 above 300° C. and below 600° C. for a preparatory process time t1 of at least several hours. According to an embodiment the preparatory process temperature T1 of an isothermal preparatory heat treatment is in a range from 450° C. to 550° C., e.g., in a range from 470° C. to 510° C. and lasts for at least 1 h, at least 2 h, or at least 5 h such that the available hydrogen atoms occupy all available crystal lattice defects in the surface portion. Since formation of HDs is tied to the presence of suitable lattice defects, no more HDs can form once all suitable lattice defects are occupied. In this way a stable preparatory HD concentration Nhd1 can be achieved, which does not further increase as long as no further crystal defects are generated and which does not decrease as long as the applied temperature does not exceed the dissociation temperature of the HDs.

After the preparatory heat treatment, information as regards a cumulative dopant concentration Ncum in the surface portion is obtained. The cumulative dopant concentration Ncum is a total net dopant concentration of all electrical active dopants after the preparatory heat treatment and includes at least the preparatory HD concentration Nhd1 after the preparatory heat treatment. In case the initial semiconductor material of the semiconductor substrate 100 is highly resistive, the cumulative dopant concentration Ncum is equal to or closely approximates the preparatory HD concentration Nhd1. In case the initial semiconductor material contains extrinsic dopant atoms such as, e.g., arsenic (As), boron (B), and/or phosphorus (P) atoms, the cumulative dopant concentration Ncum is the sum of the preparatory hydrogen-related donor concentration Nhd1 and the extrinsic dopant concentration Next, wherein the extrinsic dopant concentration Next is the net dopant concentration resulting from the total content of donor and acceptor atoms. According to an embodiment, the extrinsic dopant concentration Next may be in a range from 0 to 1E14 $cm^{-3}$, e.g., from 0 to 5E12 $cm^{-3}$.

The preparatory HD concentration Nhd1 results from the density of crystal lattice defects in the surface portion, the content of hydrogen in the semiconductor substrate 100 after the irradiation process, the content of interstitial oxygen and carbon dissolved in the silicon crystal as well as the temperature profile applied during the preparatory heat treatment. The parameters of the process for generating crystal lattice defects, the hydrogen content and the temperature profile of the preparatory heat treatment may be selected such that (i) the preparatory heat treatment saturates the crystal lattice defects suitable for formation of HDs, (ii) the HDs are thermally stable in a range between 400° C. and 480° C., and (iii) Ncum exceeds a target dopant concentration Ntar by at least 5%, e.g., by at least 20%.

From the cumulative dopant concentration Ncum a control unit 490 determines a main temperature profile Tproc2($t$) for a main heat treatment that reduces the number of hydrogen-related donors such that a final total dopant concentration Ntot fulfills a predetermined condition, e.g., deviates by not more than 15%, by not more than 10% or by not more than 5% from the target dopant concentration Ntar.

The final total dopant concentration Ntot is a total net dopant concentration of all electrical active dopants after the main heat treatment and includes at least the final HD concentration Nhd2 after the main heat treatment. In case the initial semiconductor material of the semiconductor substrate 100 is highly resistive, the final total dopant concentration Ntot is equal to or closely approximates the final HD concentration Nhd2. In case the initial semiconductor material contains extrinsic dopant atoms the final total dopant concentration Ntot is the sum of the final HD concentration Nhd2 and the extrinsic dopant concentration Next.

The main temperature profile Tproc2($t$) may be an isothermal profile defined by a constant main process temperature Tproc2, a main process time tproc2 during which the main process temperature Tproc2 is applied as well as falling and trailing temperature ramps before and after applying Tproc2.

The control unit 490 determines the main temperature profile Tproc2($t$) by considering the HD dissociation rate in the semiconductor substrate 100. The minimum main process temperature Tproc2 for dissociating the HDs is higher than the preparatory process temperature Tproc1, e.g., above 380° C. or, in case Tproc1 exceeds 380° C., above 480° C.

The semiconductor substrate 100 may be subjected to the main heat treatment in a second heating chamber 470 at any later stage of processing after obtaining the information on the cumulative dopant concentration Ncum and before the semiconductor substrate 100 is separated into a plurality of identical semiconductor dies. According to an embodiment, the main heat treatment is performed before forming a metallization on the front surface 101. The main heat treatment may be a dedicated heat treatment exclusively serving for dissociating a desired number of HDs.

With the method of FIG. 1 a simple feed-forward control either achieves a well-defined low-doped surface portion in a high-resistive semiconductor substrate 100 or completes an original background dopant concentration in a comparatively low-resistive semiconductor substrate 100 to a desired target donor concentration by filling a gap between the target dopant concentration Ntar and the extrinsic dopant concentration Next with HDs.

Compared to other approaches including feed-forward control, for example, by filling the gap between the target dopant concentration Ntar and an extrinsic dopant concentration Next with a defined generation of OTDs (oxygen-related thermal donors), the present embodiment gets along without knowledge of the exact content of interstitial oxygen and carbon. Instead, the method makes use of the observation that, other than a generation rate, a total dissociation rate of HDs does not depend or depends only to a negligible degree on the presence of other impurities, e.g., interstitial oxygen and carbon atoms, at least in a range of interest. The range of interest includes the typical specification ranges for interstitial oxygen and carbon impurities in mCz:Si and a target dopant concentration Ntar below 3E15 cm-3.

For example, interstitial oxygen in combination with hydrogen forms hydrogen-related donor complexes that differ from other oxygen-free hydrogen-related donor complexes. But at temperatures above 460° C. the hydrogen-related donors with and without oxygen-related donors such as ODTs dissociate at almost equal rates.

As a consequence the method can get along without knowledge of the exact oxygen content and it is sufficient that the semiconductor substrate 100 fulfills the usual tolerance conditions as regards oxygen content and carbon content.

FIGS. 2A and 2C show pertinent dopant concentrations and the concentration of interstitial oxygen at different stages of processing for different types of the semiconductor substrates 100.

FIG. 2A concerns a high-resistive semiconductor substrate that contains extrinsic dopant atoms only as unwanted impurities with a concentration lower than 1E12 cm$^{-3}$.

Diagram 901 refers to a high-resistive semiconductor substrate before the formation of HDs. The intrinsic oxygen concentration is within a specified range between a minimum intrinsic oxygen concentration NiO1 and a maximum intrinsic oxygen concentration NiO2. A concentration of substitutional carbon is within a specified range between a minimum concentration of substitutional carbon NsC1 and a maximum concentration of substitutional carbon NsC2.

Knowledge about the tolerance ranges ΔNiO=|NiO1−NiO2| and ΔNsC=|NsC1−NsC2| suffices to determine parameters of a process for forming HDs, for example, the dose of a proton implant and a temperature profile in a preparatory heat treatment for diffusing the protons to achieve, by generating HDs, a cumulative dopant concentration Ncum, which is safely greater than the target dopant concentration Ntar.

Diagram 902 shows the cumulative dopant concentration Ncum, which is at least 5%, e.g., at least 20% higher than the target dopant concentration Ntar. The cumulative dopant concentration Ncum is equal to a preparatory HD concentration Nhd1 that includes hydrogen-related donors both with and without oxygen and/or carbon atoms.

Irrespective of the oxygen content, the carbon content, the content of oxygen-related dopants and/or the content of carbon-related dopants, at least for a range of interest with Ncum lower than 3E15 cm-3 the total dissociation rate of hydrogen-related donors can be considered to be the same and knowledge about Ncum is sufficient to define a main temperature profile that reduces Ncum to a value Ntot, which deviates from the target dopant concentration Ntar by not more than 15%, e.g., by not more than 10% or by not more than 5% as illustrated in diagram 903.

Figure 2B:
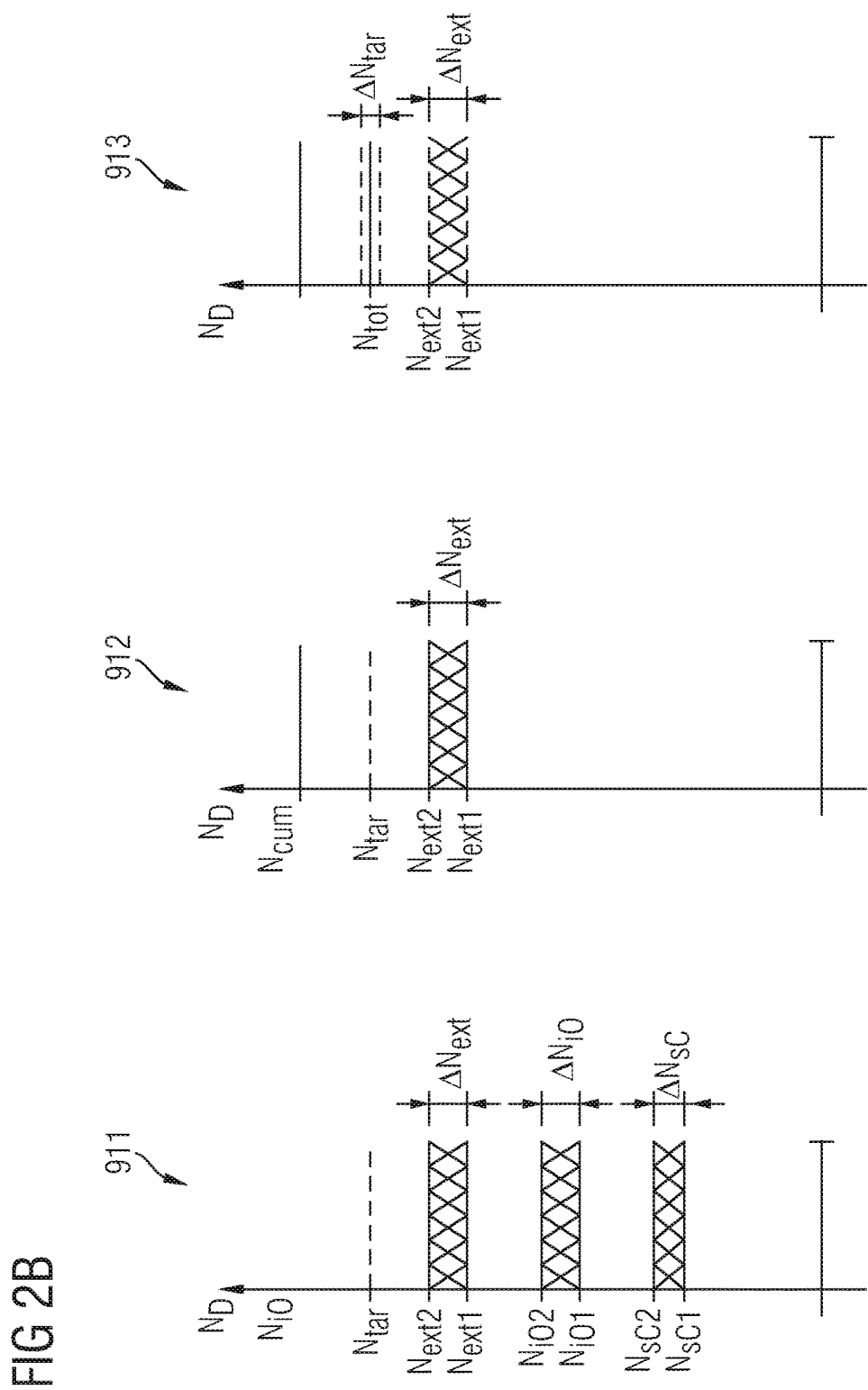
FIG. 2B is a schematic diagram for illustrating dopant concentrations and concentration of interstitial oxygen at different process stages according to an embodiment concerning p-type semiconductor substrates.

FIG. 2B refers to an n-doped semiconductor substrate with an initial extrinsic donor concentration $N_D$ of donors, for example, arsenic and/or phosphorus atoms within a specified range between a minimum external dopant concentration Next1 and maximum external dopant concentration Next2, with Next2 lower than Ntar as shown in diagram 911.

Knowledge about the tolerance ranges ΔNiO and/or ΔNsC as well as ΔNext may suffice to determine parameters of a process for forming HDs, for example, by implanting and diffusing protons to achieve, after the formation of HDs in a preparatory heat treatment between, e.g., 470° C. and 510° C., a cumulative dopant concentration Ncum, which is the sum of the external dopant concentration Next and the preparatory HD concentration Nhd1, to be safely greater than the target dopant concentration Ntar as shown in diagram 912.

The following main heat treatment reduces Ncum to Ntar as illustrated in diagram 913.

Determining the temperature profile of the main heat treatment may get along with the knowledge of only the cumulated dopant concentration Ncum and the dissociation rate provided that the absolute variation of the external dopant concentration is sufficiently low.

Otherwise, i.e., if the fluctuation of external dopant concentration has significant impact on the final total dopant concentration Ntot, the process for determining the process parameters may include a further process for obtaining information about the actual extrinsic dopant concentration Next in the concerned semiconductor substrate. For example, a spreading resistance measurement may determine the extrinsic dopant concentration at an early stage of processing before forming the hydrogen-related dopants.

According to another embodiment, a first partial heat treatment for the dissociation process ends after a defined first dissociation time and information descriptive for a reduced cumulated dopant concentration Nredcum is obtained in the same way as for the cumulated dopant concentration Ncum to determine, from the first dissociation time and the difference between Ncum and Nredcum, the ratio of HDs to extrinsic dopants in the cumulated dopant concentration Ncum. The parameters of the process for generating crystal lattice defects, the hydrogen content and the temperature profile of the preparatory heat treatment and the first partial heat treatment for the dissociation process are selected such that the reduced cumulated dopant concentration Nredcum exceeds a target dopant concentration Ntar by at least 5%, e.g., by at least 20%. Then a second dissociation time for a second partial heat treatment of the dissociation process can be tuned to the calculated ratio of HDs to extrinsic dopants.

In FIG. 2C the diagrams 921-923 correspond to the diagrams 911-913 in case the semiconductor substrate is p-type and the extrinsic dopant concentration Next is an acceptor concentration $N_A$.

FIGS. 3A to 3K concern the manufacture of a plurality of semiconductor dies from a common semiconductor substrate 100, wherein formation of hydrogen-related donors includes implantation of protons.

Semiconducting regions, for example, anode layers of a semiconductor diode or body and source regions of transistor cells are formed at a front side of a semiconductor substrate 100 in device regions 610. Further, insulating and conductive structures, for example, planar gate structures or trench gate structures, field plate structures and termination structures may be formed within each device region 610.

Figure 3A:
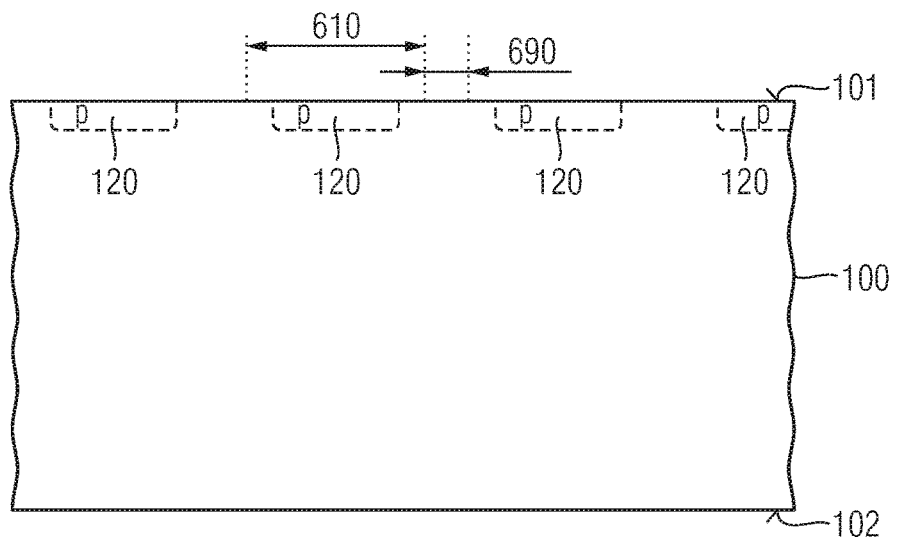
FIG. 3A is a schematic vertical cross-sectional view of a portion of a semiconductor substrate for illustrating a method of manufacturing semiconductor devices including defined dissociation of hydrogen-related donors, after forming p-type anode/body wells in device regions.

The semiconductor substrate 100 shown in FIG. 3A may be intrinsic, or may contain extrinsic dopants, such as boron, phosphorus, arsenic, antimony and contaminants such as interstitial oxygen and substitutional carbon atoms. The device regions 610 form a matrix with lines and columns, wherein a kerf region 690 separates neighboring device regions 610 from each other. The kerf region 690 forms a grid, wherein each mesh of the grid includes one device region 610.

FIG. 3A shows p-type anode/body wells 120 as a pars-pro-toto example of a semiconducting structure for a device region 610, wherein the anode/body well 120 may be the anode layer of a power semiconductor diode or the body well of a transistor cell array that further includes n-type source regions between the front surface 101 and the anode/body wells 120.

Formation of the anode/body wells 120 and further semiconducting regions may include implanting the dopants into the semiconductor substrate 100, annealing the crystal damage and integrating the implanted dopant atoms at regular crystal lattice sites as well as diffusing the implanted dopant atoms at temperatures above 800° C.

After finalization of the semiconducting regions such as the anode/body wells 120, e.g., after annealing and diffusing, a particle implant generates crystal lattice defects, for example, point defects or multi-point defects in a surface portion 110 that directly adjoins the front surface 101. The particle implant may be performed after formation of the gate dielectric.

Figure 3B:
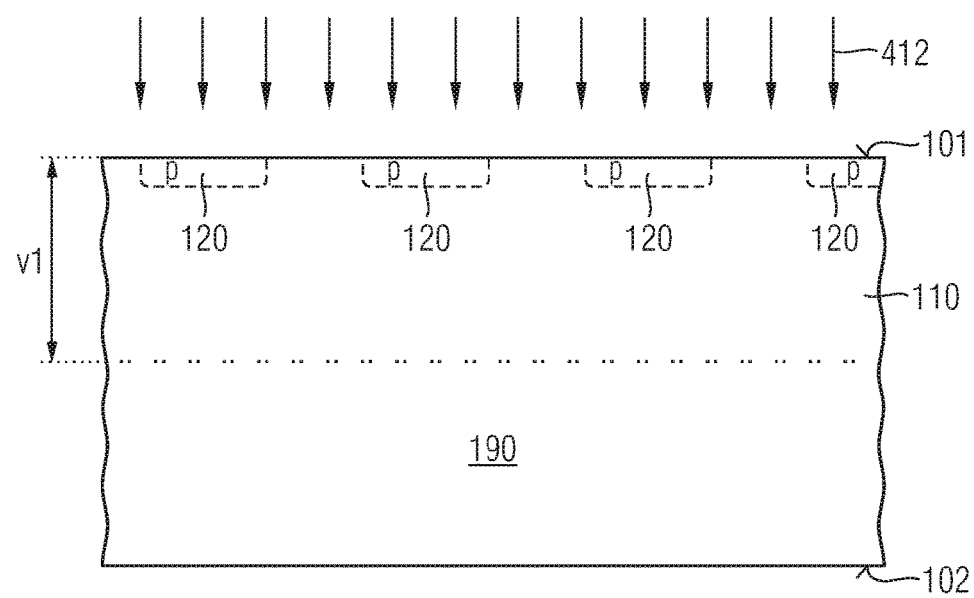
FIG. 3B is a schematic vertical cross-sectional view of the semiconductor substrate portion of FIG. 3A, during a first implant generating crystal lattice defects in a surface portion.

FIG. 3B shows a particle beam 412 directed to the front surface 101. The particle beam 412 may impinge orthogonal to the front surface 101 to exploit channeling effects for increasing the implant depth. According to an embodiment, an implant angle between the normal to the front surface 101 and the particle beam 412 is in a range from 3° to 10° to avoid channeling effects.

The particles in the particle beam 412 may be electrons, neutrons or helium ions. According to an embodiment, the particles are protons. The implanted particles come to rest at a projected range defined, e.g., by the energy of the particles, the mass of the particles, and substrate characteristics. In the surface portion 110 the particles generate crystal lattice defects, for example, point defects. A first vertical extension v1 of the surface portion 110 is defined by the distance of the projected range of the implanted particles from the front surface 101. A base portion 190 of the semiconductor substrate 100 between the surface portion 110 and a supporting surface 102 opposite to the front surface 101 remains widely unaffected and does not show any significant increase of crystal lattice defects.

Irradiation with the particle beam 412 may be performed after finalizing the anode/body wells 120 and further semiconducting elements.

A preparatory heat treatment is applied to the semiconductor substrate 100. The preparatory heat treatment may directly follow the irradiation with the particle beam 412 of FIG. 3B provided that the particles are protons. Otherwise a step of supplying hydrogen to the semiconductor substrate 100 precedes the preparatory heat treatment.

The preparatory heat treatment may be a dedicated heat treatment serving no other purpose than forming HDs in the surface portion 110. According to other embodiments the preparatory heat treatment may be a heat treatment serving also a further purpose in the course of processing semiconductor elements in the device regions 610.

During the preparatory heat treatment the maximum temperature applied to the semiconductor substrate 100 is above 450° C. and at most 550° C. such that HDs of a species of lower thermal stability (HD1) dissociate and exclusively HDs of a species of higher thermal stability (HD2) are formed. The preparatory heat treatment diffuses the hydrogen, wherein the diffusion length achieved by the preparatory heat treatment is at least equal to the first vertical extension v1 of the surface portion 110. In the surface portion 110, which contains the previously formed crystal lattice defects, the hydrogen atoms decorate the point defect complexes and form donor-like defect states, which are stationary and thermal stable up to about 500° C.

Figure 3C:
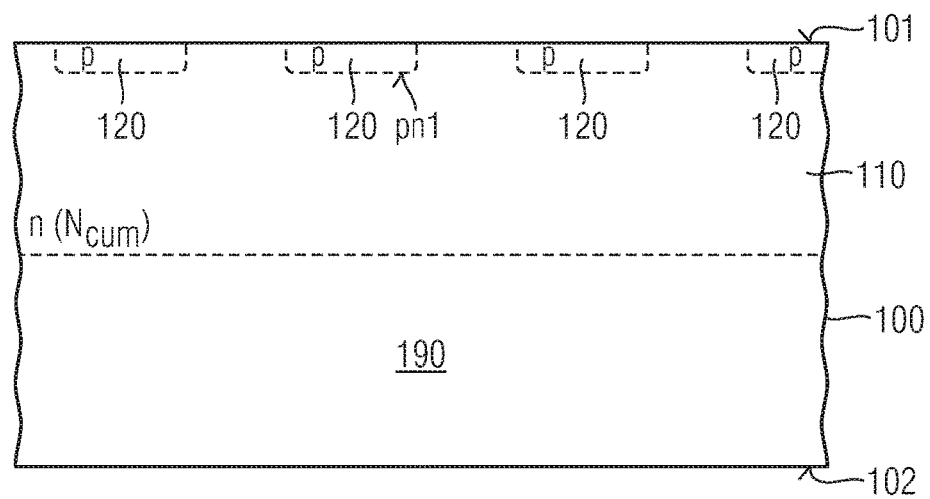
FIG. 3C is a schematic vertical cross-sectional view of the semiconductor substrate portion of FIG. 3B, after a preparatory heat treatment for achieving a cumulative dopant concentration containing HDs.

According to FIG. 3C, the surface portion 110 becomes n-type and forms first pn junctions pn1 with the anode/body wells 120. Formation of the hydrogen-related donors may include the formation of OTDs, wherein the final concentration of OTDs in the surface portion 110 depends on the initial content of interstitial oxygen. The concentration of HDs may further depend on the content of other impurities, such as carbon.

In the surface portion 110 the cumulative dopant concentration Ncum is the sum of the current preparatory HD concentration Nhd1 of all types of HDs after the preparatory heat treatment and an extrinsic dopant concentration Next. The parameters of the HD generation process, for example, proton implant dose and temperature as well as duration of the preparatory heat treatment are selected such that the cumulative dopant concentration Ncum is greater than a target dopant concentration Ntar of the surface portion 110. For example, the cumulative dopant concentration Ncum is at least 10% or at least 20% higher than the target dopant concentration Ntar. The selection of the parameters of hydrogen implant and preparatory heat treatment may be selected such that for a given generation rate of HDs, the specification for the cumulative dopant concentration Ncum is fulfilled even for a semiconductor substrate 100 with the minimum specified content of interstitial oxygen, the minimum content of substitutional carbon, and with either the minimum specified content of extrinsic donors or the maximum concentration of extrinsic acceptors.

At any later process stage after the preparatory heat treatment but before any process applying temperatures above the dissociation temperature of the thermally more stable HD species (HD2), information about the cumulative dopant concentration Ncum is obtained from the semiconductor substrate 100. The measurement concerning the cumulative dopant concentration Ncum may be carried out before applying any further significant thermal budget to the semiconductor substrate 100 after the preparatory heat treatment.

The measurement may include capacitance-voltage profiling across a depletion zone formed at least in parts in the surface portion 110.

For example, a voltage is applied across a pn junction in the semiconductor substrate 100 and a capacitance across the pn junction is measured as a function of the applied voltage, wherein the capacitance of the pn junction is a function of the width of the depletion zone. From the dependence of the depletion width upon the applied voltage, information on the dopant concentration in the surface portion 110 can be obtained.

Figure 3D:
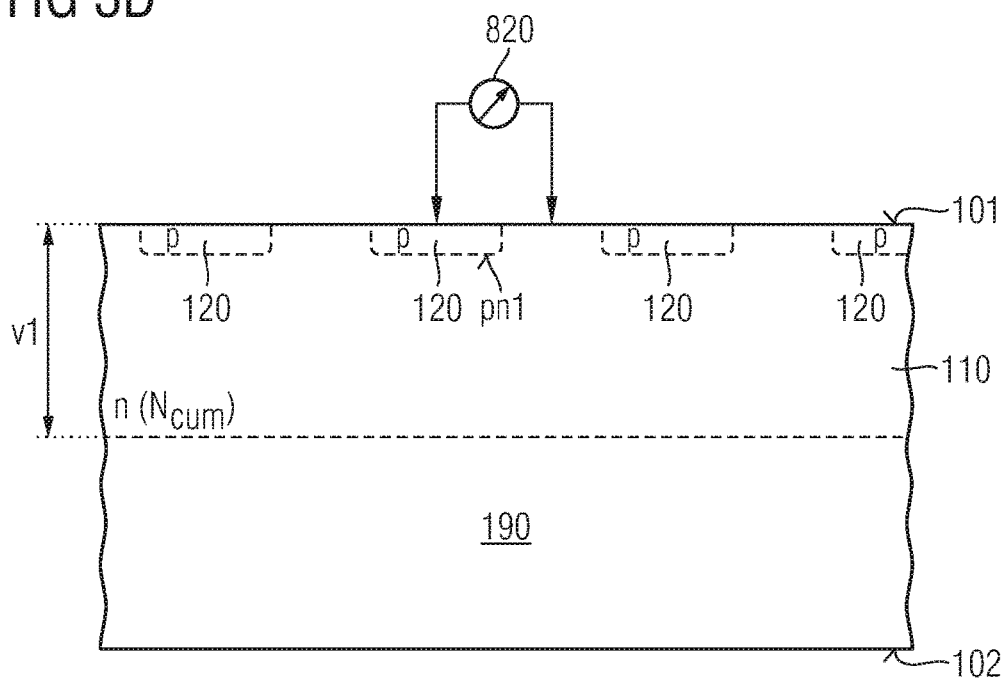
FIG. 3D is a schematic vertical cross-sectional view of the semiconductor substrate portion of FIG. 3C, during obtaining information about the cumulative dopant concentration.

FIG. 3D shows a measurement unit 820 temporally connected through contact probes to the n-type surface portion 110 and to the p-type anode/body well 120. According to other embodiments, dedicated pn regions may be formed in the device regions 610 or in the kerf region 690. Based on a known dissociation rate of HDs and on knowledge upon the cumulative dopant concentration Ncum a main temperature profile Tproc2(t) for a main heat treatment may be determined that dissociates excess HDs such that the remaining HDs and the extrinsic dopant concentration supplements to a final total dopant concentration Ntot that deviates from the target dopant concentration Ntar by not more than 15%.

Figure 3E:
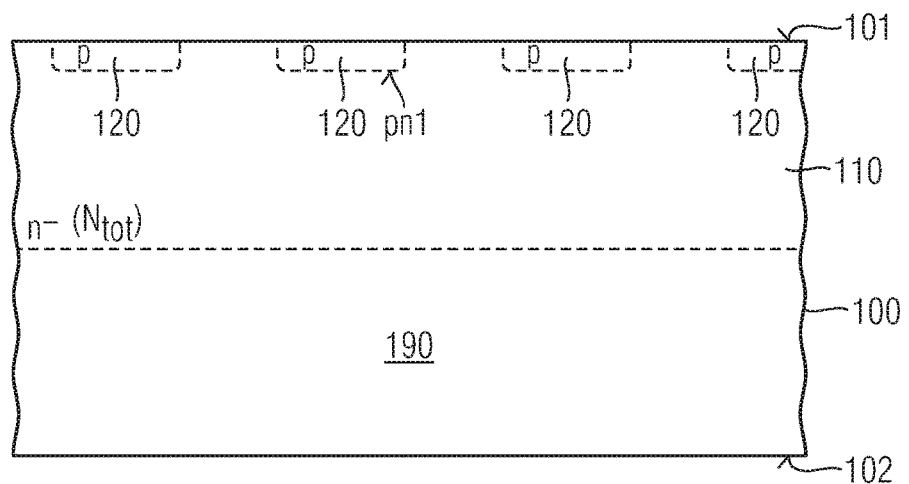
FIG. 3E is a schematic vertical cross-sectional view of the semiconductor substrate portion of FIG. 3D, after a main heat treatment dissociating a predetermined amount of hydrogen-related donors.

FIG. 3E shows the semiconductor substrate 100 after the semiconductor substrate 100 is subjected to the main heat treatment applying the main temperature profile Tproc2(t). The process exploits the fact that the same dissociation rate can be assumed for HDs both in the presence of more oxygen and/or carbon and in the presence of less oxygen and/or carbon. As a consequence, the process can get along without knowledge of the exact original oxygen content of the semiconductor substrate 100. Provided that the deviation of the extrinsic dopant concentration from a mean value is sufficiently low and in case the overall extrinsic dopant concentration is at most 10% of the target dopant concentration Ntar, the process also gets along without knowledge of the exact extrinsic dopant concentration.

In case a variation of the extrinsic dopant concentration is comparatively high and the portion of the extrinsic dopant concentration Next exceeds 10% of the target concentration Ntar, the main heat treatment may be split up into a first partial heat treatment that closes only a portion of the gap between the cumulated dopant concentration Ncum and the target dopant concentration Ntar, for example, by 50% to achieve a reduced cumulative dopant concentration Nredcum.

The first partial heat treatment may be a dedicated heat treatment serving no other purpose than dissociating a certain portion of the HDs. Alternatively, the first partial heat treatment applies a defined thermal budget in the course of another process, e.g., during a deposition, reflow, annealing or etching process.

The reduced cumulative dopant concentration Nredcum may be measured in the same way as Ncum. From the reduced cumulative dopant concentration Nredcum, the cumulative dopant concentration Ncum and the known dissociation rate of HDs, exact information of the external dopant concentration Next can be obtained. A second partial heat treatment decreasing the reduced cumulative dopant concentration Nredcum to Ntot takes into account the additional information about the external dopant concentration Next such that a closer agreement of the final total dopant concentration Ntot with the target dopant concentration Ntar can be achieved even at comparative high fluctuations of the external dopant concentration Next.

Alternatively, information about the extrinsic dopant concentration may be obtained, e.g., by a spreading resistance measurement at an early process stage before forming any doped regions.

Processing of the semiconductor substrate 100 may proceed with finalizing semiconducting, insulating and conductive structures in the semiconductor substrate 100, as well as forming an interlayer dielectric and a first metallization 360 partially separated from the semiconductor substrate 100 by the interlayer dielectric on the front side of the semiconductor substrate 100. A stiff carrier member 810, e.g., a grinding tape, may be reversibly attached at the front side of the semiconductor substrate 100, for example, by adhesion on the first metallization 360.

Figure 3F:
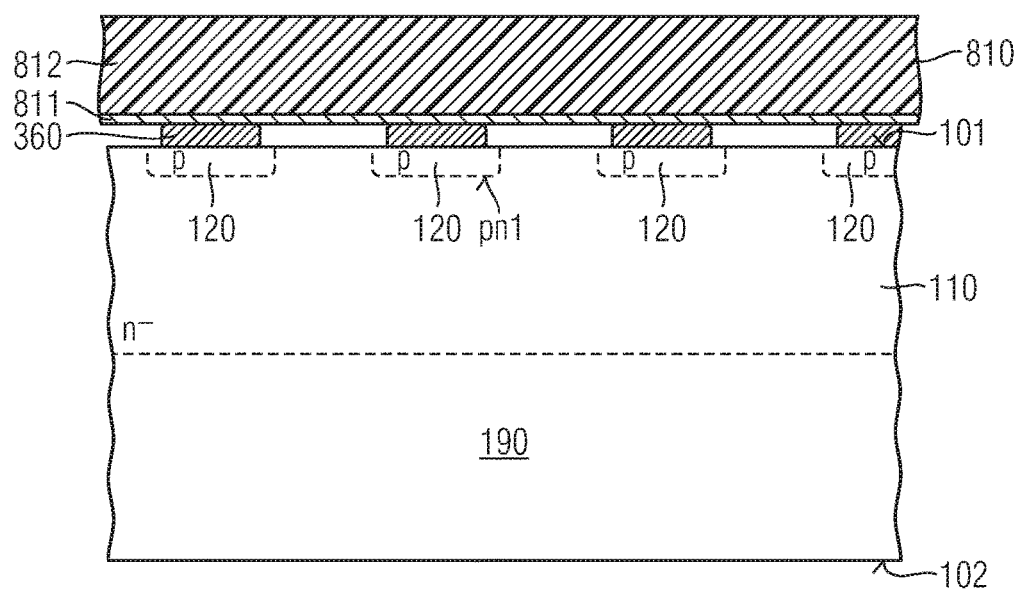
FIG. 3F is a schematic vertical cross-sectional of the semiconductor substrate portion of FIG. 3E, after attaching a carrier member at a front side of the semiconductor substrate.

FIG. 3F shows separated portions of the first metallization 360 for each device region 610. The carrier member 810 may include a rigid, non-stretching film, for example, a temporary bonding adhesive tape including a PET/LCP (polyethylenterephthalat/liquid crystal polymer) base film 812 and a radiation/thermal release adhesive film 811 for reversibly adhering the base film 812 to the first metallization 360.

At least the unaffected base portion 190 of the semiconductor substrate 100 may be removed. In addition, at least a section of the surface portion 110 including the end-of-range peaks of the particle beam 412 of FIG. 3B may be removed. For example, a grinding process starting from the back of the semiconductor substrate 100 opposite to the carrier member 810 may remove the base portion 190, wherein a grinding wheel may grind the semiconductor substrate 100 from the supporting surface 102. The grinding process may stop after detection of the doped surface portion 110.

Figure 3G:
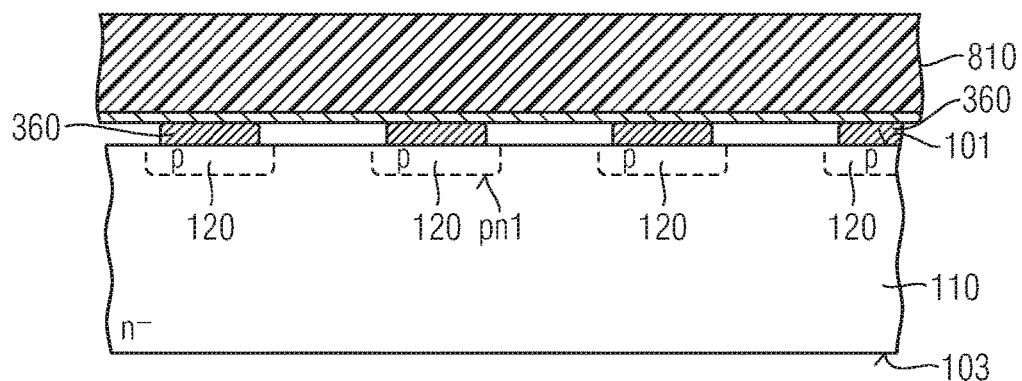
FIG. 3G is a schematic vertical cross-sectional of the semiconductor substrate portion of FIG. 3F, after thinning the semiconductor substrate from a rear side.

FIG. 3G shows the surface portion 110 exposed by removal of the base portion 190 of FIG. 3F along a grinded surface 103 of the semiconductor substrate 100.

Figure 3H:
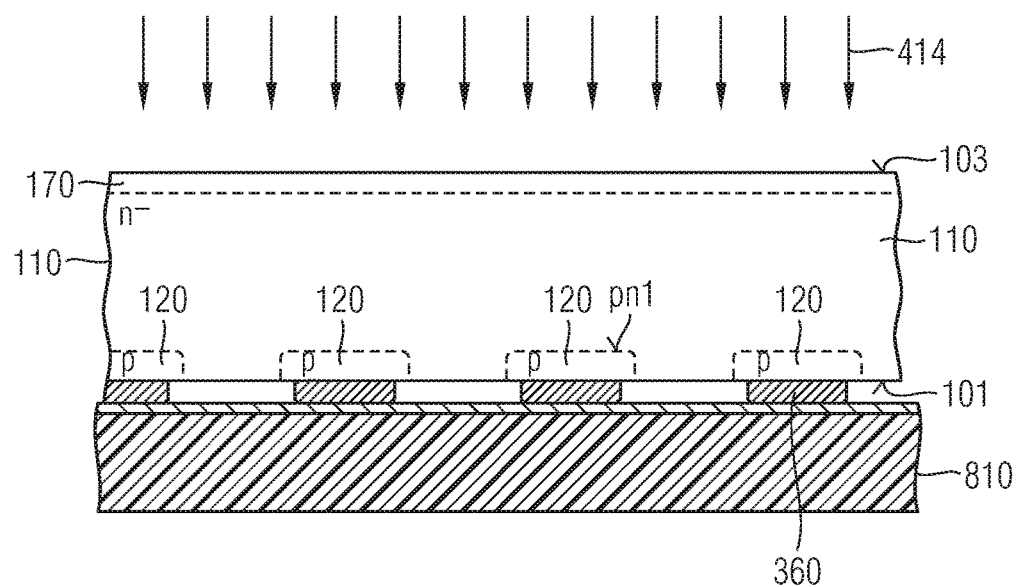
FIG. 3H is a schematic vertical cross-sectional of the semiconductor substrate portion of FIG. 3G, during a second implant through the rear side for forming a field stop layer.

FIG. 3H shows rear side processing including formation of a field stop layer 170 may be applied to the grinded surface 103. According to an embodiment, an implant beam 414 introduces hydrogen through the grinded surface 103, wherein crystal lattice defects are generated in a rear side surface section with a vertical extension of some ten micrometers. A supplementary heat treatment at a temperature below the dissociation temperature of the thermally more stable HD species (HD2) diffuses the implanted hydrogen. Hydrogen atoms diffusing into the rear side surface section are gettered at the crystal lattice defects generated by the implant beam 414 and form a doped field stop layer 170. By contrast, hydrogen atoms diffusing into the surface portion 110 are not gettered, because all previously formed crystal lattice defects in the surface portion 110 are saturated by the preceding main heat treatment.

Figure 3I:
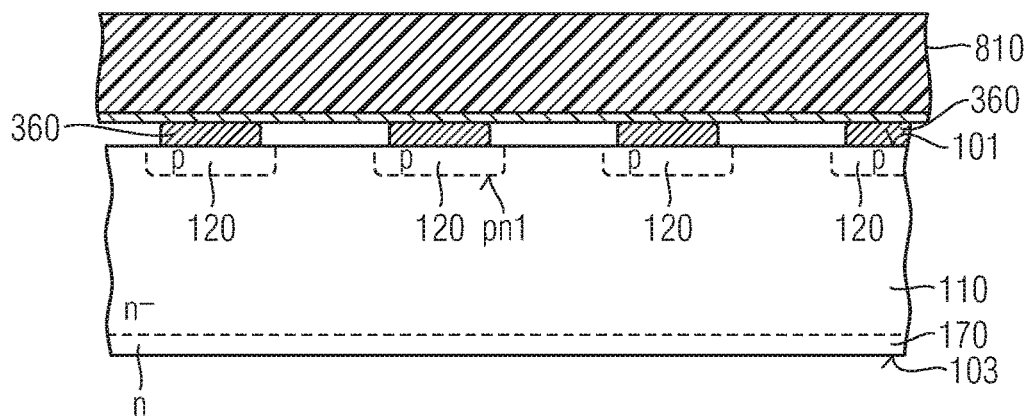
FIG. 3I is a schematic vertical cross-sectional of the semiconductor substrate portion of FIG. 3H, after a supplementary heat treatment forming the field stop layer.

FIG. 3I shows the field stop layer 170 formed between the surface portion 110 and the grinded surface 103. Alternatively, the section of the surface portion 110 including the end-of-range peak may be used as the field stop layer 170.

Further rear side processing may define a heavily doped contact layer, e.g., by implanting extrinsic dopant atoms through the exposed grinded surface 103 and may form a second metallization 370 on the exposed grinded surface 103.

Figure 3J:
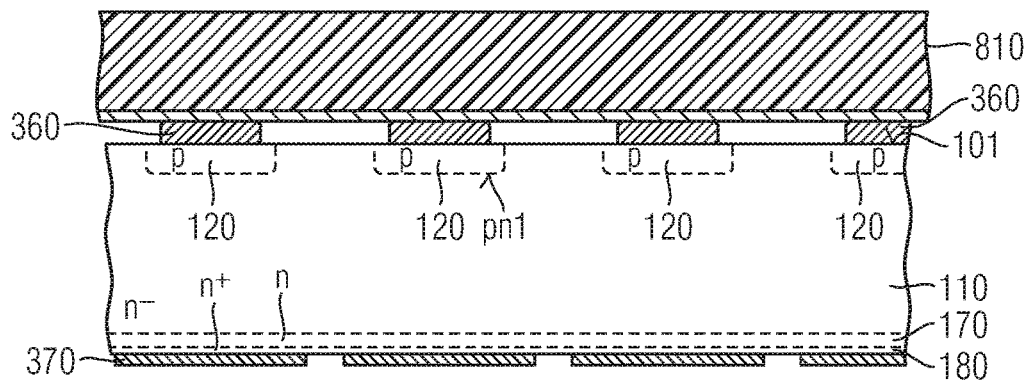
FIG. 3J is a schematic vertical cross-sectional of the semiconductor substrate portion of FIG. 3I, after forming a rear side metallization.

FIG. 3J shows the thinned semiconductor substrate 100 including the surface portion 110 containing the anode/body wells 120, the heavily doped contact layer 180 along the grinded surface 103 and the field stop layer 170 sandwiched between the surface portion 110 and the contact layer 180. The contact layer 180 may be n-type for the processing of n-IGFETs and semiconductor diodes and may be p-type for n-IGBTs. The second metallization 370 may be a continuous layer or may be patterned such that separated portions of the second metallization 370 are formed for each device region 610. A dicing process separates the device regions 610 along the kerf region 690.

Figure 3K:
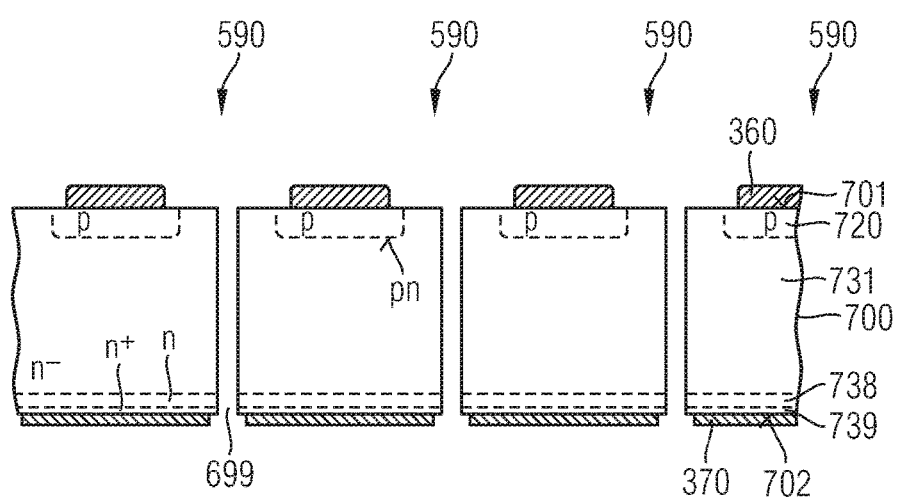
FIG. 3K is a schematic vertical cross-sectional of semiconductor dies obtained from the semiconductor substrate portion of FIG. 3J by separation along dicing streets.

FIG. 3K shows a plurality of semiconductor dies 590 obtained by dicing along dicing streets 699 in the kerf region 690 of FIG. 3J, wherein a semiconductor portion 700 with a first surface 701 at a front side and a planar second surface 702 parallel to the first surface 701 on the back results from the semiconductor substrate 100 of FIG. 3J. The semiconductor portion 700 includes an anode/body well 720 electrically connected to a first metallization 360 at the front side and may form a pn-junction with a drift zone 731. The drift zone 731 results from the surface portion 110 of FIG. 3J and a drift zone dopant concentration Ndrift in the drift zone 731 is equal to Ntot. A field stop zone 738 results from the field stop layer 170 and a contact zone 739 from the contact layer 180 of the semiconductor substrate 500 of FIG. 3J.

Figure 4:
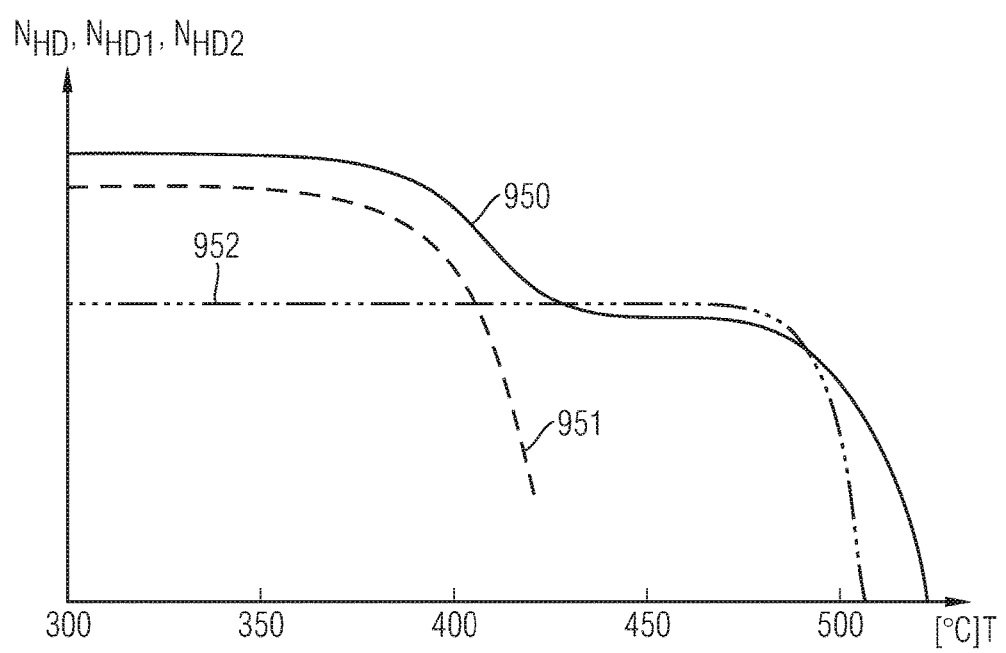
FIG. 4 is a schematic diagram illustrating a hydrogen-related donor concentration in a semiconductor substrate as a function of a temperature of a heat treatment lasting for five hours to discuss background useful for understanding of the embodiments.

FIG. 4 schematically shows the content of HDs in a semiconductor substrate as a function of a temperature of an isothermal heat treatment lasting for five hours. Profile 950 shows the total concentration $N_{HD}$ of HDs that has a first plateau for temperatures below about 350° C., a first significant drop between 350° and 420° C., a second plateau between 420° and 480° C. and a final drop starting at about 480° C. The profile 950 can be modeled by assuming the existence of two species of HDs that differ as regards temperature stability. A less stable first species of HDs (HD1) is stable up to temperatures of 380° C. and completely dissociates at about 420° C. as illustrated with profile 951. A more stable second species of HDs (HD2) is stable up to temperatures of 480° C. as illustrated with profile 952. The embodiments use the different temperature stability of HD1 and HD2 to form two different doped regions of HD1 and HD2 without the need of mutual adjustment of the thermal budgets for the two different doped regions.

Figure 5A:
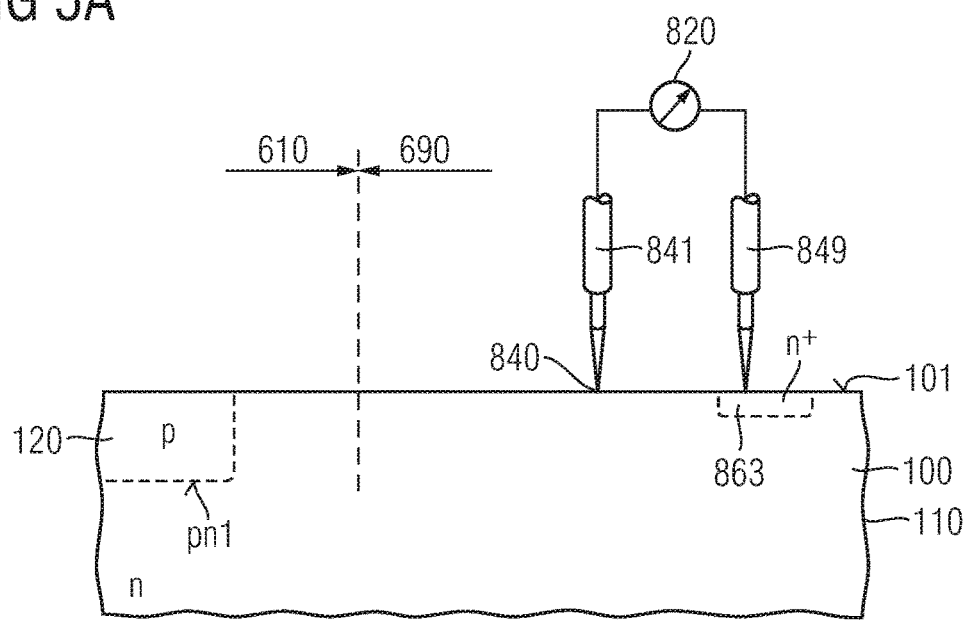
FIG. 5A is a schematic diagram for illustrating a capacitance-voltage measurement for determining a cumulative dopant concentration by using a contact probe forming a Schottky contact.
Figure 5B:
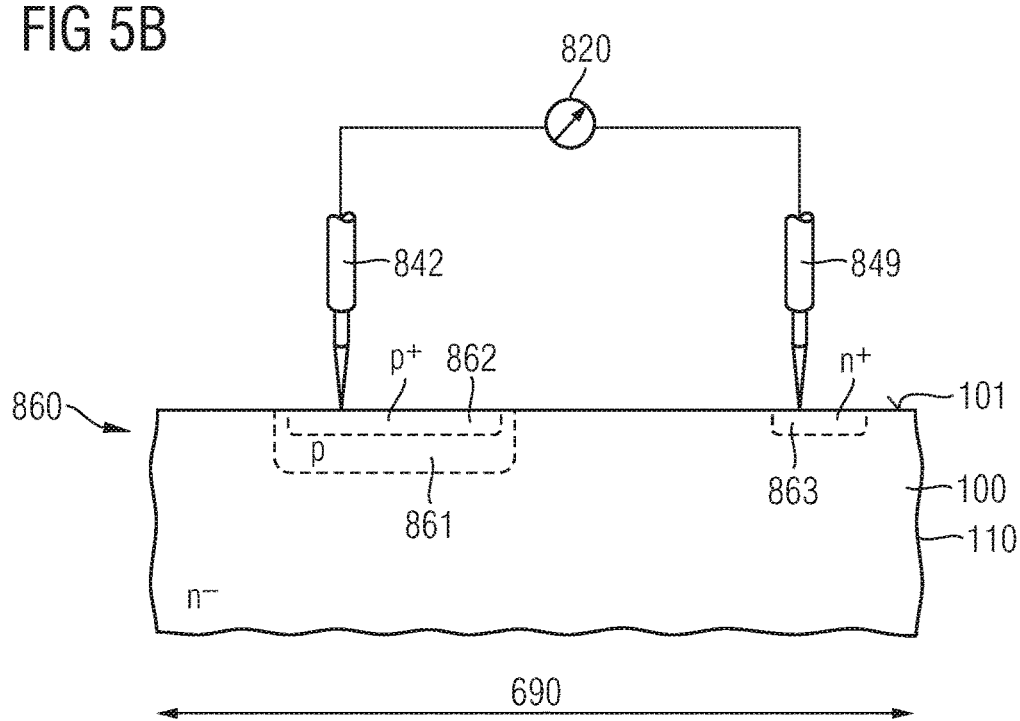
FIG. 5B is a schematic diagram for illustrating a capacitance-voltage measurement for determining a cumulative dopant concentration by using an auxiliary structure in a kerf region.
Figure 5C:
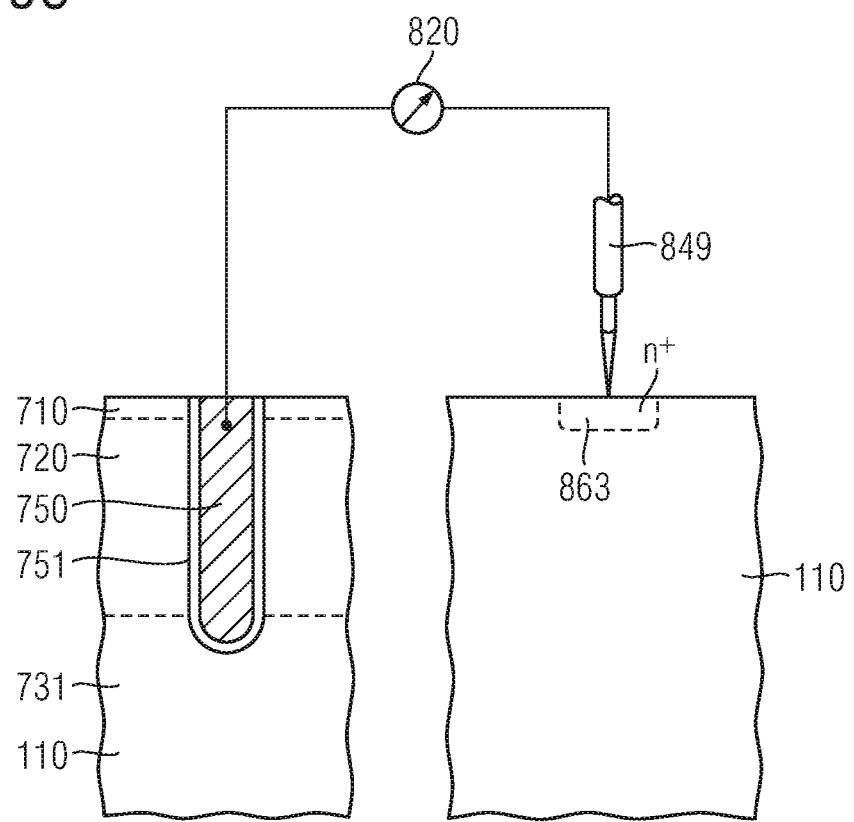
FIG. 5C is a schematic diagram for illustrating a capacitance-voltage measurement for determining a cumulative dopant concentration by using a gate electrode.

FIGS. 5A to 5C refer to methods of obtaining information about the cumulative dopant concentration Ncum after a preparatory heat treatment. The cumulative dopant concentration Ncum may be evaluated at a process stage without ohmic contact at a rear side, at a process stage with a temporary ohmic contact structure, e.g., heavily doped poly-silicon at the rear sides, or with a final rear side contact structure.

FIG. 5A shows a measurement arrangement for CV profiling across a Schottky contact 840 formed by a first contact probe 841 pressed against a section of the front surface 101 exposing the surface portion 110 in any of the device regions 610 or in the kerf region 690 where a comparatively wide portion of the surface portion 110 is exposed. An n-type contact region 863 may provide an ohmic transition between the surface portion 110 and a reference probe 849.

FIG. 5B shows an auxiliary structure 860 completely formed in a kerf region 690. The auxiliary structure 860 includes a p-type well 861 that may be formed contemporaneously with the anode/body wells 120 in the device regions 610 of FIG. 3A, a heavily doped p-type contact region 862 that may be contemporaneously formed with p-type contact regions in the device regions 610 and a heavily doped n-type contact region 863 that may be contemporaneously formed with source regions in the device regions 610. A portion of the surface portion 110 separates the p-type well 861 from the n-type contact region 863 such that a second contact probe 842 in contact with the p-type contact region 862 and a reference probe 849 in contact with n-type contact region 863 facilitate a CV profiling of the pn junction between the surface portion 110 and the p-type well 861.

A CV profiling measures the characteristics of the depletion zone formed along the pn junction between the p-type well 861 and the surface portion 110 in the kerf region 690.

In FIG. 5C a direct contact to a gate electrode 750 replaces the first contact probe 841 of FIG. 5A and allows a CV profiling across a gate dielectric 751 separating the gate electrode 750 from a drift zone 731 formed from a portion of the surface portion 110. The weakly doped drift zone 731 forms a pn junction with an anode/body well 720 that separates the drift zone 731 from a source zone 710.

Information about the cumulative dopant concentration Ncum after the preparatory heat treatment may also be obtained from a breakdown measurement at a conventional test facility for breakdown tests. The breakdown measurement typically uses the metallization at the front side and at the rear side. In case the metallization is not stable at the typical main process temperature Tproc2 for dissociating the HDs, e.g., in case the metallization contains aluminum Al as an alloy constituent, the metallization is removed before the main heat treatment. Alternatively, a thermally more stable metallization without aluminum is provided or a sacrificial conductive layer from, e.g., heavily doped polycrystalline silicon is formed for the purpose of the breakdown measurement and replaced or covered with a final metallization after the main heat treatment.

Figure 6:
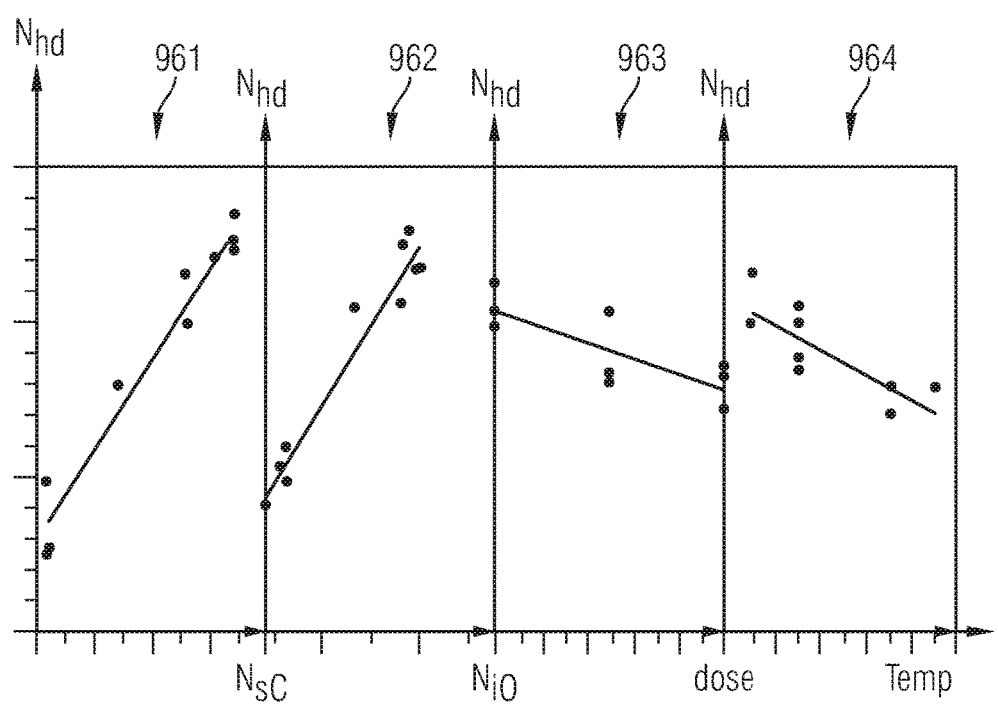
FIG. 6 includes schematic diagrams for illustrating the impact of oxygen and carbon content in the semiconductor substrate on generation and dissociation rate of hydrogen-related donors.

FIG. 6 is a combined diagram plotting the integrated active doping of a field stop as a function of different parameters.

Diagram 961 shows that the portion of activated HDs increases with increasing carbon concentration NsC. Diagram 962 shows the same effect for increasing oxygen concentration NiO. According to diagrams 963, 964 the impact of variations of the carbon concentration and the oxygen content NsC, NiO decreases with increasing dose of a hydrogen implant for forming the surface portion and with increasing temperature of the main heat treatment.

Figure 7A:
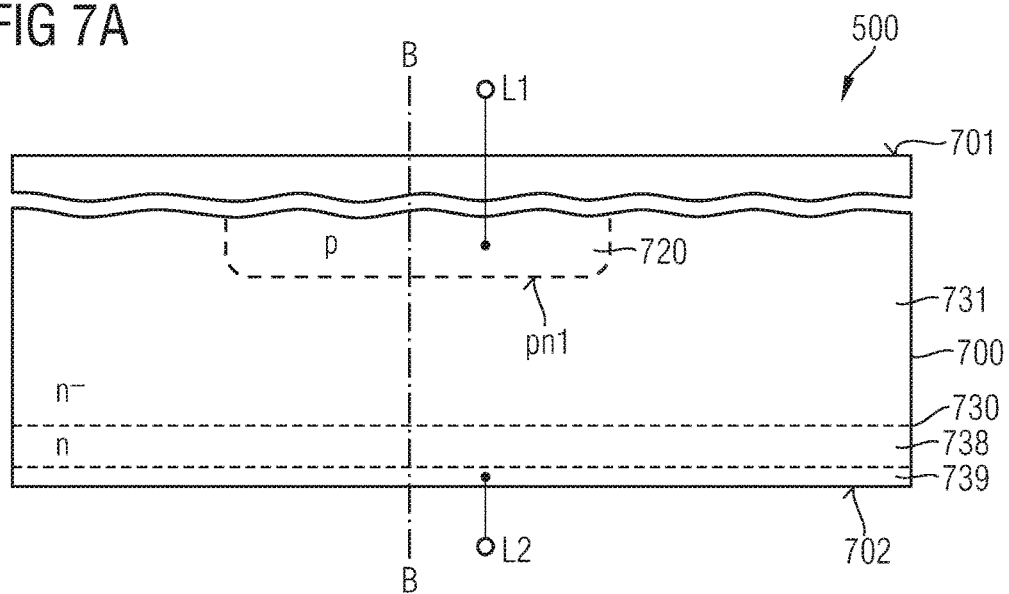
FIG. 7A is a schematic vertical cross-sectional view of a power semiconductor device with a drift zone in which HDs represent at least 25% of the total dopant concentration according to an embodiment.

FIG. 7A illustrates a power semiconductor device 500 obtained from one of the above described methods. A single crystalline semiconductor material, e.g. silicon, forms a semiconductor portion 700 with a planar first surface 701 at a front side as well as a planar second surface 702 parallel to the first surface 701 on the back opposite to the front side.

A minimum distance between the first and second surfaces 701, 702 depends on the voltage blocking capability of the power semiconductor device 500. For example, the distance between the first and second surfaces 701, 702 may be in a range from 90 µm to 200 µm in case the power semiconductor device 500 is specified for a blocking voltage of about 1200 V. Other embodiments related to power semiconductor devices with higher blocking capabilities may provide semiconductor portions 700 with a thickness up to several 100 µm.

In a plane parallel to the first surface 701 the semiconductor portion 700 may have a rectangular shape with an edge length in the range of several millimeters or a circular shape with a diameter of several centimeters. Directions parallel to the first surface 701 are horizontal directions and directions perpendicular to the first surface 701 are vertical directions.

The semiconductor portion 700 includes an anode/body well 720 electrically connected to a first load terminal L1. A heavily doped contact layer 739 is formed along the second surface 702 and is electrically connected to a second load terminal L2.

A weakly doped drift zone 731 forms one or more pn junctions pn1 with the anode/body well 720. An effective dopant concentration in the drift zone 731 may be at least $1E12$ cm$^{-3}$ and at most $1E17$ cm$^{-3}$, typically in the range between $1E13$ cm$^{-3}$ and $1E15$ cm$^{-3}$. The doping in the drift zone 731 may correspond to an initial background doping in the semiconductor portion 700. At least 25%, e.g., at least 50% of the donors in the drift zone 731 are HDs, wherein the HDs contain a first type of HDs containing oxygen atoms, carbon atoms or both oxygen and carbon atoms and a second type of HDs that does not contain neither oxygen nor carbon. The further donors in the drift zone 731 may be hydrogen-related donors or extrinsic dopant atoms such as arsenic, antimony and/or phosphorus atoms.

A field stop zone 738 may separate the contact zone 739 and the drift zone 731 and forms either a unipolar junction or a pn junction with the contact zone 739 and a unipolar junction with the drift zone 731. The field stop zone 738 may contain HDs based on an implant of light ions, e.g., protons and/or extrinsic dopant atoms such as phosphorus, boron, antimony and/or arsenic atoms.

Figure 7B:
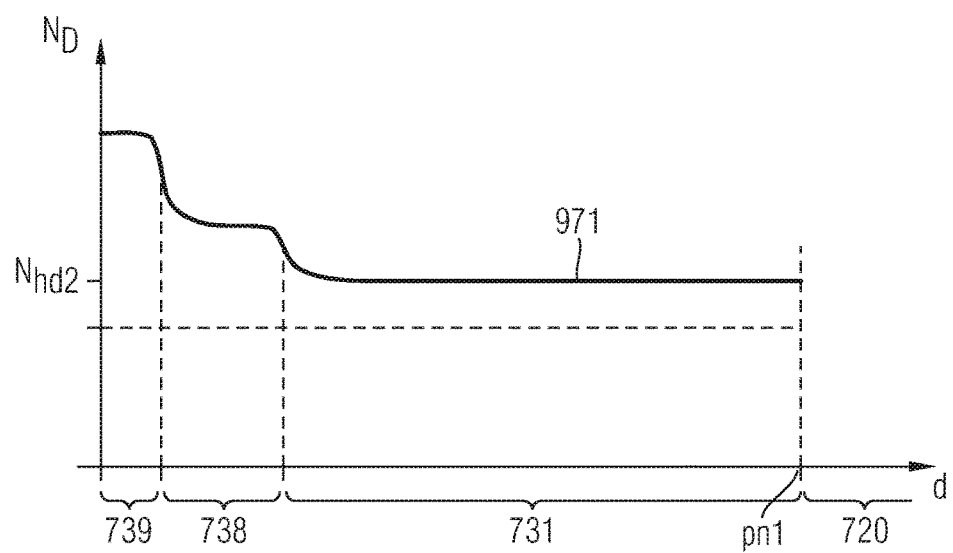
FIG. 7B is a schematic diagram illustrating a vertical dopant profile through the power semiconductor device of FIG. 7A.

FIG. 7B shows a vertical dopant profile 971 along line B-B of FIG. 7A. The contact zone 739 may be n-doped or p-doped or may include zones of both conductivity types. The dopant concentration in the contact zone 739 along the second surface 702 is sufficiently high to form an ohmic contact with a load electrode directly adjoining the second surface 702. For example, an n-doped contact zone 739 may have a mean net dopant concentration in a range from 1E18 $cm^{-3}$ to 1E20 $cm^{-3}$, for example from 5E18 $cm^{-3}$ to 5E19 $cm^{-3}$. The predominant dopants in the contact zone 739 may be extrinsic dopant atoms such as boron (B) atoms, arsenic (As) atoms, antimony (Sb) atoms or phosphorus (P) atoms.

In the field stop zone 738 the mean net dopant concentration is at most 10% of the maximum dopant concentration in the contact zone 739. For example, the mean dopant concentration in the field stop zone 738 may be in a range from 1E14 $cm^{-3}$ to 1E17 $cm^{-3}$, for example from 1E15 $cm^{-3}$ to 5E16 $cm^{-3}$, by way of example. The vertical extension of the field stop zone 738 may be in a range from 1 μm to 20 μm, for example from 2 μm to 10 μm. The predominant dopants in the field stop zone 738 may be extrinsic dopants or HDs, e.g., HDs of the HD1 species.

In the drift zone 731 the mean net dopant concentration is in a range from 1E12 $cm^{-3}$ to 1E17 $cm^{-3}$, for example, in a range from 3E12 to 5E15 or from 1E14 $cm^{-3}$ to 5E15 $cm^{-3}$ and the ratio of HDs to other dopants is at least 25%, e.g., at least 50%, wherein the HDs include HDs with oxygen and/or carbon and HDs with neither oxygen nor carbon. The HDs may be HDs of the HD2 species. The further dopants in the drift zone 731 may be extrinsic dopants. The vertical dopant profile 971 may show steps along the transitions between the contact zone 739 and the field stop zone 738 as well as between the field stop zone 738 and the drift zone 731.

The field stop zone 738 avoids that the depletion zone and the electric field in the gradually expanding depletion zone reach an electrode at d=0 at the rear side or a backside emitter. When the electric field expands into the direction of the rear side, the power semiconductor device 500 can continuously supply charge carriers from the contact zone 739 for supporting an external current flow.

Figure 8A:
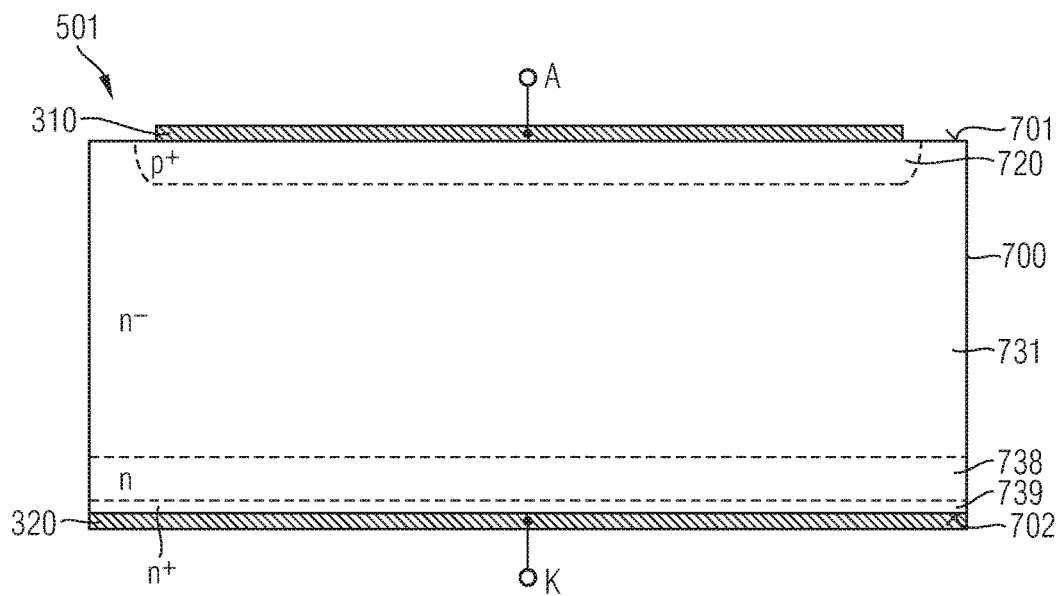
FIG. 8A is a schematic vertical cross-sectional view of a power semiconductor diode with HDs representing at least 25% of a total dopant concentration in a drift zone according to an embodiment.

FIG. 8A shows a power semiconductor diode 501 with a nominal forward current greater 1000 mA, e.g., greater 10 A or greater 100 A, based on the semiconductor device 500 of FIG. 7A. An anode/body well 120 forms an ohmic contact with a first load electrode 310 at the front side. The first load electrode 310 forms or is electrically connected to an anode terminal A. The heavily doped contact zone 739 forms an ohmic contact with a second load electrode 320 on the back. The second load electrode 320 forms or is electrically connected to a cathode terminal K.

Figure 8B:
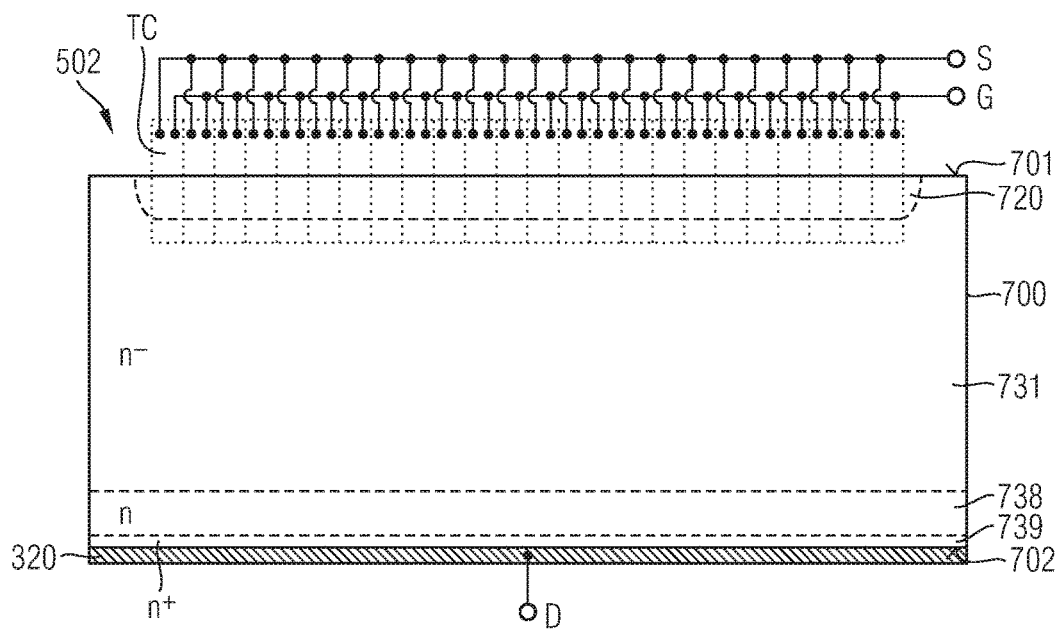
FIG. 8B is a schematic vertical cross-sectional view of an IGFET (insulated gate field effect transistor) with HDs representing at least 25% of a total dopant concentration in a drift zone according to a further embodiment.

FIG. 8B refers to an IGFET 502. As regards details of the semiconductor portion 700, the drift zone 731, the field stop zone 738, the contact zone 739, which is effective as drain, and the vertical dopant profile reference is made to the description of FIGS. 7A to 7B. The IGFET 502 includes transistor cells TC, which may be IGFET cells with n-doped source zones and with the anode/body well 720 forming body zones of the transistor cells TC. The body zones separate the source zones from the drift zone 731, respectively. The source zones may be electrically connected or coupled to a first load electrode at the front side. The first load electrode may form or may be electrically connected to a source terminal S.

Gate electrodes of the transistor cells TC may be electrically connected or coupled to a gate terminal G and may be capacitively coupled to the body zones through gate dielectrics. Subject to a voltage applied to the gate terminal G, inversion channels are formed in the body zones and provide an electron flow through the transistor cells TC such that in an on-state of the IGFET 502 electrons enter the drift zone 731 through the transistor cells TC.

The transistor cells TC may be planar cells with lateral gate structures arranged outside of the contour of the semiconductor portion 700 or trench cells with trench gate structures extending from the first surface 701 into the semiconductor portion 700. For example, the source and body zones of the transistor cells TC may be formed in semiconductor mesas separated by the trench gate structures.

Figure 8C:
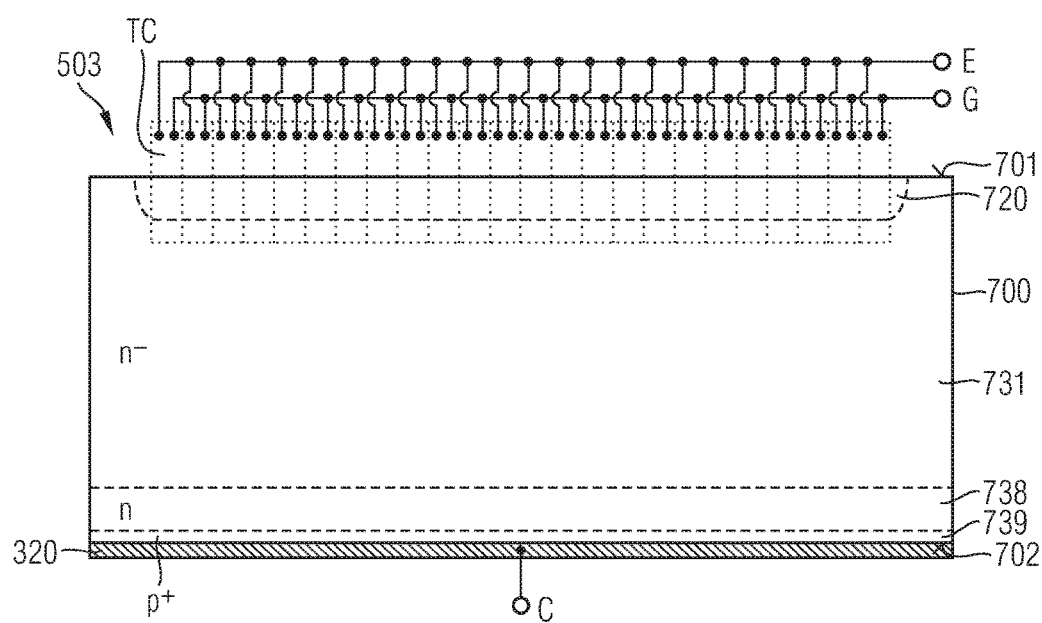
FIG. 8C is a schematic vertical cross-sectional view of an IGBT (insulated gate bipolar transistor) with HDs representing at least 25% of a total dopant concentration in a drift zone according to another embodiment.

FIG. 8C refers to an IGBT 503, for example a PT-IGBT with a p-type contact zone 739 and with the second load electrode 320 electrically connected to a collector terminal C The source and body zones are electrically connected or coupled to an emitter terminal E. For further details, reference is made to the description of the power semiconductor diode 501 of FIG. 8A and the IGFET 502 of FIG. 8B.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
   generating crystal lattice defects in a horizontal surface portion of a semiconductor substrate;
   forming hydrogen-related donors in the surface portion;
   obtaining information about a cumulative dopant concentration of dopants including the hydrogen-related donors, in the surface portion;
   determining, based on the information about the cumulative dopant concentration, a main temperature profile for dissociating a defined portion of the hydrogen-related donors; and
   subjecting the semiconductor substrate to a main heat treatment applying the main temperature profile to obtain, in the surface portion, a final total dopant concentration deviating from a target dopant concentration by not more than 15%.

2. The method of claim 1, wherein the surface portion contains extrinsic dopants and the cumulative dopant concentration is the sum of an extrinsic net dopant concentration and a preparatory hydrogen-related donor concentration after the forming of the hydrogen-related donors.

3. The method of claim 1, wherein the semiconductor substrate contains extrinsic donors and an extrinsic net dopant concentration is at least 1E13 $cm^{-3}$.

4. The method of claim 1, wherein the semiconductor substrate contains extrinsic donors and an extrinsic net dopant concentration is at most 5E12 $cm^{-3}$.

5. The method of claim 1, wherein the semiconductor substrate is intrinsic.

6. The method of claim 1, wherein forming the hydrogen-related donors comprises a preparatory heat treatment for diffusing hydrogen into the surface portion.

7. The method of claim 1, wherein generating the crystal lattice defects comprises irradiating the semiconductor substrate with protons.

8. The method of claim 7, further comprising:
after implanting the protons, thinning the semiconductor substrate from a side opposite to the front surface so that a base portion comprising an end-of-range peak of the proton implant is removed.

9. The method of claim 7, wherein forming the hydrogen-related donors comprises a preparatory heat treatment for diffusing the implanted protons into the surface portion.

10. The method of claim 9, wherein a maximum temperature applied in the preparatory heat treatment is above 470° C. and at most 510° C.

11. The method of claim 1, wherein a maximum temperature applied in the main heat treatment is above 510° C.

12. The method of claim 1, wherein at least 50% of a total duration of the main temperature profile is an isothermal process given by a constant main process temperature and a main process time for which the constant main process temperature is applied.

13. The method of claim 1, further comprising:
forming anode/body wells in the semiconductor substrate, wherein the anode/body wells form first pn junctions with cathode/drain structures,
wherein the cathode/drain structures comprise drift zones in the surface portion,
wherein a dopant concentration in the drift zones is equal to the final total dopant concentration.

14. The method of claim 1, wherein the information about the cumulative dopant concentration comprises a capacitive/voltage measurement across at least one of a pn junction and a Schottky contact formed by the surface portion.

15. The method of claim 14, wherein a contact probe is pressed against a section of the front surface exposing the surface portion.

16. The method of claim 1, further comprising:
forming an interlayer dielectric at a front side of the semiconductor substrate before subjecting the semiconductor substrate to the main heat treatment.

17. The method of claim 1, further comprising:
forming a plurality of separated semiconductor dies from the semiconductor substrate after subjecting the semiconductor substrate to the main heat treatment.

18. The method of claim 1, wherein at least 25% of donors in the semiconductor substrate are hydrogen-related donors after the main heat treatment.

19. The method of claim 1, wherein an intrinsic oxygen concentration in the semiconductor substrate is in a range from $1E17$ $cm^{-3}$ to $6E17$ $cm^{-3}$.

20. The method of claim 1, wherein a substitutional carbon concentration in the semiconductor substrate is in a range from $1E14$ $cm^{-3}$ to $5E15$ $cm^{-3}$.

21. The method of claim 1, further comprising:
after the main heat treatment, implanting protons to form a field stop layer in the semiconductor substrate.

22. The method of claim 21, further comprising:
subjecting the semiconductor substrate to a supplementary heat treatment which activates the protons to form the field stop layer,
wherein a maximum temperature applied in the supplementary heat treatment is below 420° C.

23. The method of claim 1, wherein the semiconductor substrate is subjected to the main heat treatment before forming a first metallization at a front side.

* * * * *